United States Patent [19]

Nakayama et al.

[11] Patent Number: 5,179,427
[45] Date of Patent: Jan. 12, 1993

[54] NON-VOLATILE SEMICONDUCTOR MEMORY DEVICE WITH VOLTAGE STABILIZING ELECTRODE

[75] Inventors: Ryozo Nakayama, Yokohama; Riichiro Shirota; Yasuo Itoh, both of Kawasaki; Ryouhei Kirisawa, Yokohama; Hideko Odaira, Tokyo; Masaki Momodomi, Yokohama; Yoshihisa Iwata, Yokohama; Tomoharu Tanaka, Yokohama; Seiichi Aritome, Kawasaki; Tetsuo Endoh; Fujio Masuoka, both of Yokohama, all of Japan

[73] Assignee: Kabushiki Kaisha Toshiba, Kawasaki, Japan

[21] Appl. No.: 869,123

[22] Filed: Apr. 15, 1992

Related U.S. Application Data

[63] Continuation of Ser. No. 534,876, Jun. 8, 1990, abandoned.

[30] Foreign Application Priority Data

Jun. 13, 1989 [JP] Japan .................. 1-150186

[51] Int. Cl.⁵ ................... H01L 29/68; H01L 29/78
[52] U.S. Cl. ................... 257/211; 365/185; 257/316; 257/494
[58] Field of Search ............... 357/23.5, 23.11, 45, 357/52, 71; 365/185

[56] References Cited

U.S. PATENT DOCUMENTS 4,878,199 10/1989 Mizutani .................. 357/23.5
4,918,501 4/1990 Komori et al. ............ 357/23.5
4,939,690 7/1990 Momodomi et al. ....... 357/23.5
5,008,856 4/1991 Iwahashi ................... 357/23.5

FOREIGN PATENT DOCUMENTS 59-31987 8/1984 Japan .
60-182162 9/1985 Japan .

OTHER PUBLICATIONS

"A High Density EPROM Cell and Array", Symposium on VLSI technology digest of technical papers; P89-90; May, 1986; R. Stewart et al.

Primary Examiner—Andrew J. James
Assistant Examiner—Sara W. Crane
Attorney, Agent, or Firm—Oblon, Spivak, McClelland, Maier & Neustadt

[57] ABSTRACT

A NAND cell type EEPROM has parallel data transmission lines formed above a substrate, and a memory cell section including a plurality of NAND type cell units containing a NAND type cell unit that is associated with a certain bit line of the bit lines. This NAND type cell unit has a series-circuit of a preselected number of data storage transistors with control gates, and a selection transistor. A substrate voltage-stabilizing layer is insulatively provided above the substrate and positioned in the field area in adjacent to the certain bit line. The conductive layer is connected to the substrate by a contact portion so that the substrate voltage can be constantly set to a preselected voltage potential of a fixed value during the NAND type cell unit is being subjected to the write and erase modes.

29 Claims, 5 Drawing Sheets

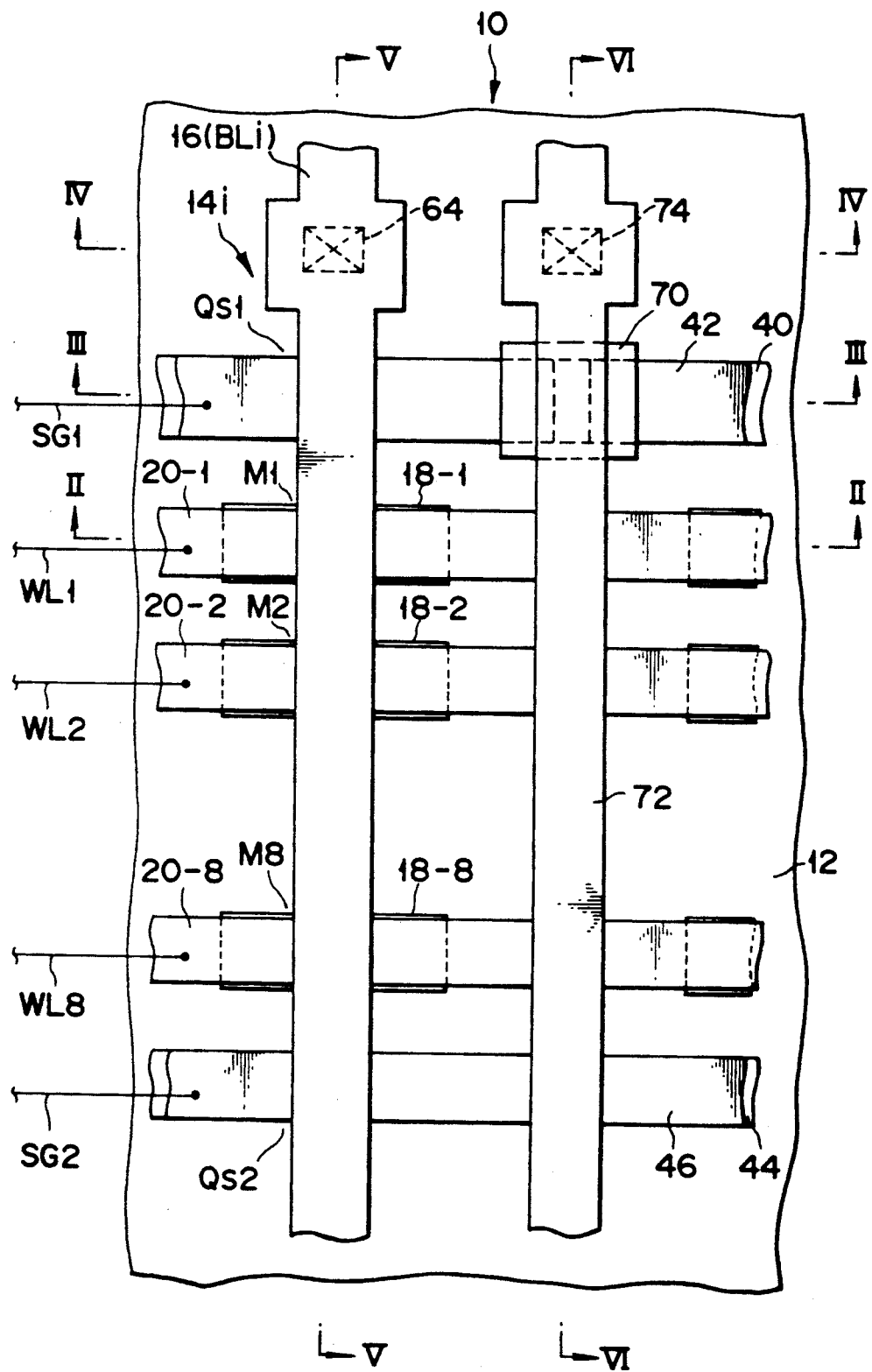
F I G. 1

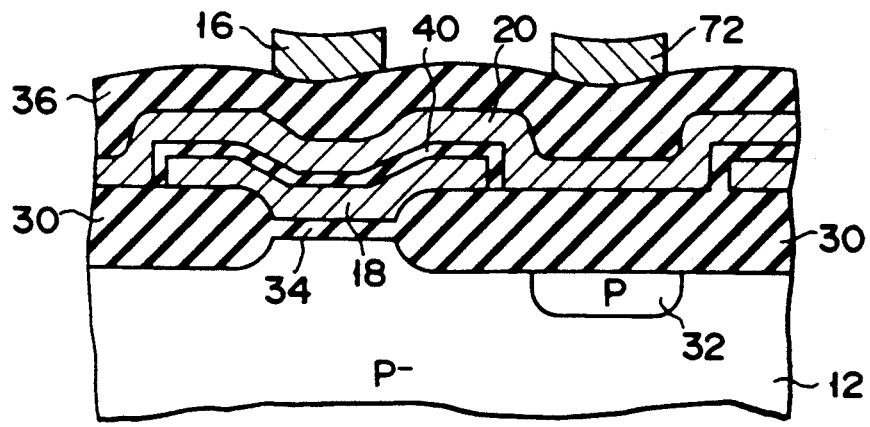
F I G. 2
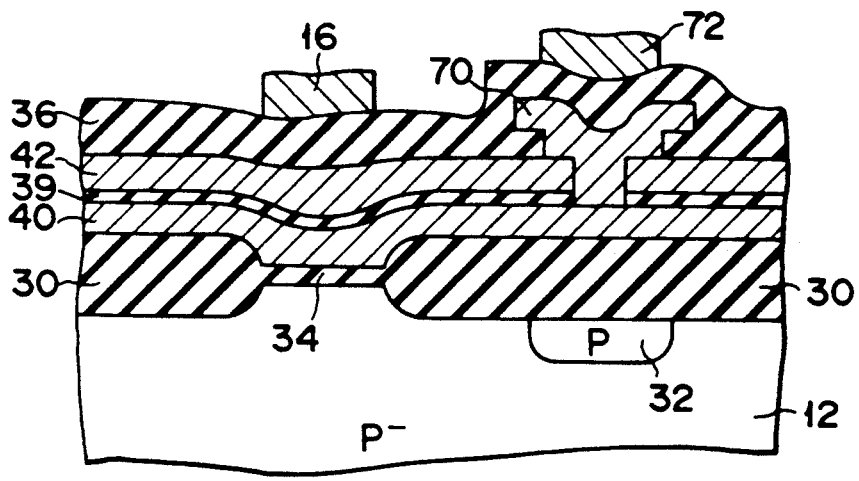
F I G. 3
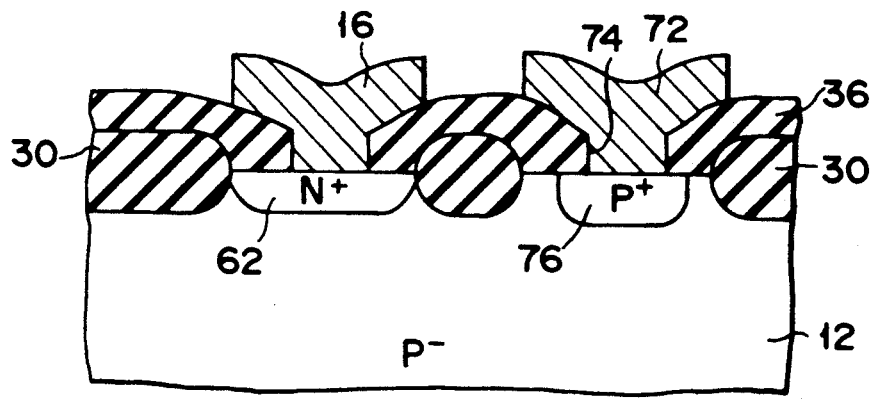
F I G. 4

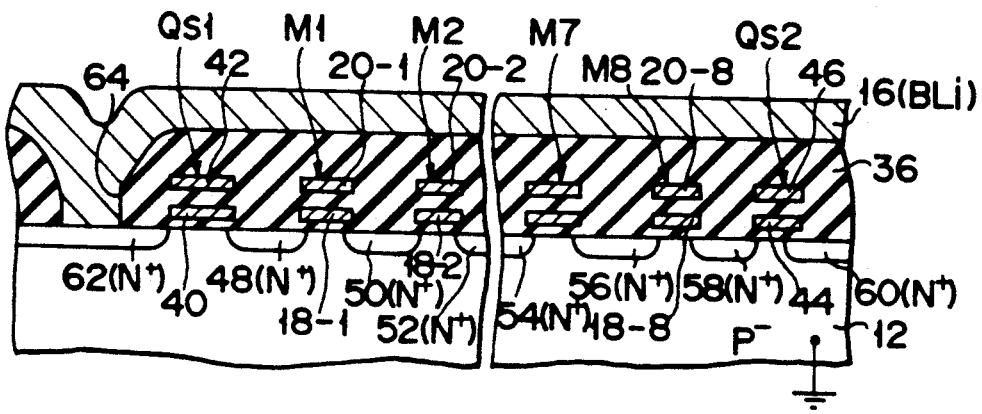
F I G. 5
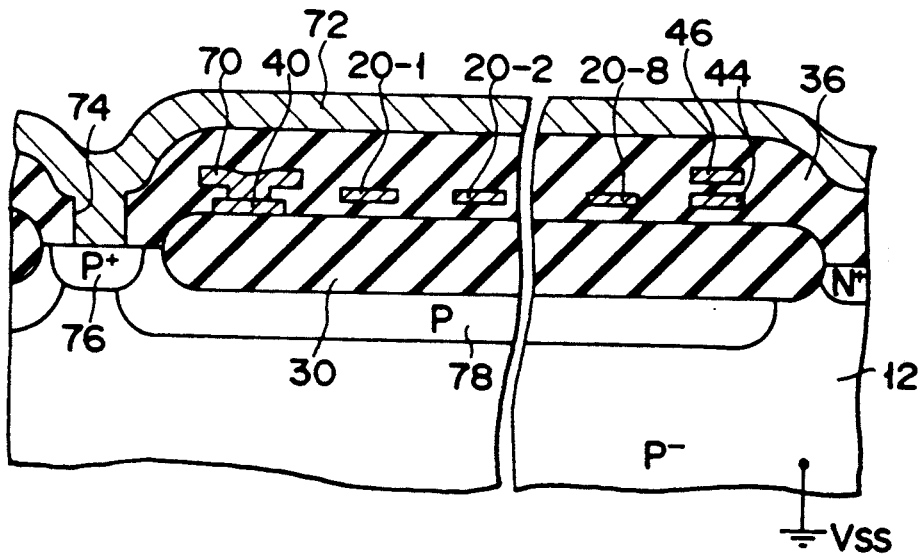
F I G. 6

NON-VOLATILE SEMICONDUCTOR MEMORY DEVICE WITH VOLTAGE STABILIZING ELECTRODE

This application is a continuation of application Ser. No. 07/534,876, filed on Jun. 8, 1990, now abandoned.

BACKGROUND OF THE INVENTION

1. Field of the Invention

The present invention relates to semiconductor memories and, in more particular, to non-volatile semiconductor memories having NAND type memory cell units which are programmable and which may be electrically erased.

2. Description of the Related Art

With the increasing needs for high performance and reliability of digital computer systems, the technique for highly integrated memory cells becomes indispensable. A solid-state memory with enhanced data storage capability has been demanded strongly, which can replace existing external data storage devices for digital computer systems, such as a magnetic floppy diskette drive unit, a fixed disk unit, or the like.

A presently available electrically erasable programmable read-only memory (to be referred to as an "EEPROM" hereinafter) has technical advantages, such as being superior in reliability and higher in data programming rate than the magnetic data storage devices are; however, the total memory amount of the EEPROM is still not so large as to replace the magnetic data storage devices. In the EEPROM, since each of the memory cells is generally constituted by two transistors, it cannot be expected that the integration density increases enough to be sufficient to enable the EEPROM to have a required amount of memory that permits the EEPROM to substitute for the known magnetic data storage devices.

Recently, a "NAND" type EEPROM has been developed as one of non-volatile semiconductor memories with enhanced storage capability. According to the memory of this type, memory cells are grouped into a preselected number of memory cell block sections, each of which includes a plurality of arrays of memory cells, what are called "NAND" cell arrays, or "NAND" cell units. Every one of the memory cells constituting the "NAND" cell unit typically consists of only one transistor of floating gate type, so that only one contact portion is required between every array of memory cells and the corresponding bit line associated therewith. The occupied area of the overall memory cell section on the substrate can thus be reduced to be much smaller than that of a conventional EEPROM, whereby the integration density of the EEPROM can be improved, with the result in the total amount of memory being increased.

According to the NAND type EEPROM, data may be written into, read from, or erased in a desired memory cell transistor by transferring by tunneling between the floating gate of the transistor and the substrate through an insulative thin-film formed therebetween. In this sense, this type of memory cell is also known as the "FETMOS" type memory cell.

More specifically, if the memory cell is an N-channel type transistor, electrons can be injected by tunneling from the drain region into the floating gate thereof by applying a high-level voltage such as 20 volts to the control gate of the cell transistor, while its drain layer is being set to 0 volts. As a result, the threshold value of the cell transistor is level-shifted in the positive polarity direction.

In order to "release" the electrons stored in the floating gate to the substrate, a high-level voltage of 20 volts, for example, is applied to the drain region of the cell transistor, with the control gate thereof being set to 0 volts. The threshold value of the transistor, in this case, is level-shifted along the negative polarity direction. The data writing and erasing operations in the cell transistor may be performed using these two different kinds of voltage applications.

To read the data stored in the cell transistor, a read voltage having a preselected potential level is applied to the control gate of the transistor. The logical "type" of stored data, i.e., logical "0" or "1," can be determined by detecting or sensing whether or not channel-current flows in the transistor under such voltage application.

The NAND type EEPROM highly integrated, however, suffers from undesirable occurrence of the "breakdown" phenomenon, as will be explained hereinafter. When the high-level voltage is applied to the drain region of a memory cell transistor during the data write and erase modes, the breakdown will occur in the PN junction, e.g., between the drain region and a channel-stopper layer formed in adjacent thereto in the substrate. Such breakdown will also occur in the surface portion of the drain region: it is generally known as the "surface breakdown."

The breakdown is very serious for the EEPROM because it damages greatly the performance of data write/erase operations. Even if it is not a "complete" breakdown, i.e., if a partial breakdown occurs, current flow in the substrate abnormally increases, which makes it difficult or impossible to successively "remove" from the floating gate the electrons being stored or accumulated therein. Difficulty in the removal of stored electrons will lead to decrease in the operating reliability of the EEPROM, or to malfunction thereof in the worst case. The same is true in the case of an EEPROM with what is called "FLOTOX" type memory cells, or of an "ultraviolet ray-erase" type EPROM.

SUMMARY OF THE INVENTION

It is therefore an object of the present invention to provide a new and improved non-volatile semiconductor memory device which is highly integrated and has enhanced operating reliability.

In accordance with the above object, the present invention is addressed to a specific non-volatile semiconductor memory device having a semiconductive substrate, parallel data transmission lines formed above the substrate, and a memory cell section containing memory cells that are associated with a certain bit line of these data transmission lines. The memory cells may include a NAND type cell unit which has a series-circuit of a preselected number of data storage transistors with control gate layers and a switching transistor. A potential stabilizer is provided which includes a conductive layer that is insulatively provided the substrate and positioned in adjacent to the certain data transmission line, for receiving a preselected constant voltage which is applied to the substrate in at least a selected time period during the NAND type cell unit is being subjected to a data write or erase operation. The preselected voltage may be a substrate voltage, or a well-potential voltage, if the NAND cell unit is formed in a semiconductive well region formed in the substrate.

Other and further objects of this invention will become obvious upon an understanding of the illustrative embodiments to be described or will be indicated in the appended claims, and various advantages not referred to herein will occur to one skilled in the art upon employment of the invention in practice.

BRIEF DESCRIPTION OF THE DRAWINGS

In the detailed description of a preferred embodiment of this invention presented below, reference is made to the accompanying drawings in which:

FIG. 1 is a diagram showing schematically a plan view of the main part of a NAND type electrically erasable programmable read-only memory (EEPROM) in accordance with one preferred embodiment of the present invention;

FIG. 2 is a diagram showing a cross-sectional view of the EEPROM along line II—II in FIG. 1;

FIG. 3 is a diagram showing a cross-sectional view of the EEPROM along line III—III in FIG. 1;

FIG. 4 is a diagram showing a cross-sectional view of the EEPROM along line IV—IV in FIG. 1;

FIG. 5 is a diagram showing a cross-sectional view of the EEPROM along line V—V in FIG. 1;

FIG. 6 is a diagram showing a cross-sectional view of the EEPROM along line VI—VI in FIG. 1;

DETAILED DESCRIPTION OF THE PREFERRED EMBODIMENTS

Figure 7:
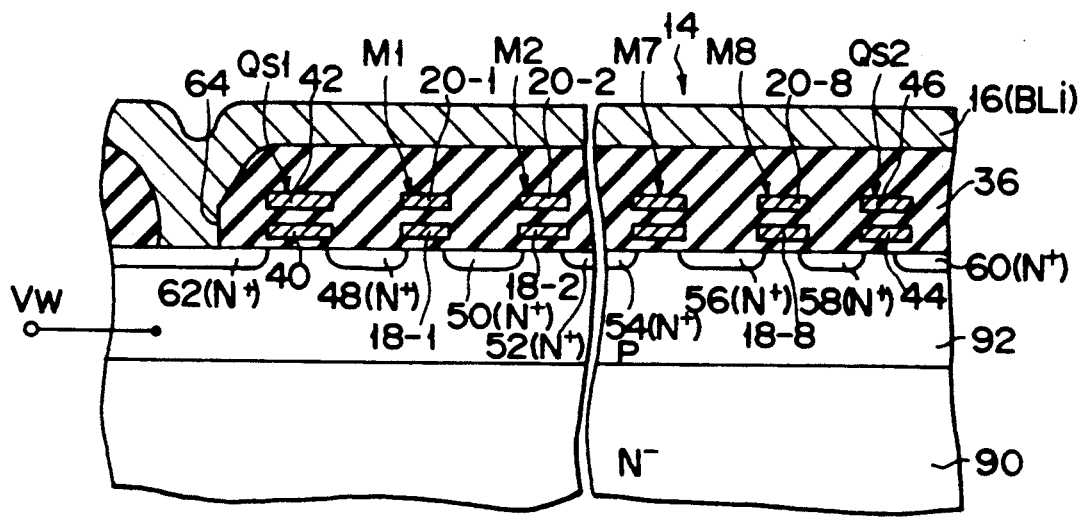
FIG. 7 is a diagram showing in a cross-section an EEPROM in accordance with another embodiment of the present invention.

Referring now to FIG. 1, an electrically erasable programmable read-only memory (EEPROM) according to one preferred embodiment of the present invention is generally designated by reference numeral "10." EEPROM 10 has a semiconductive substrate 12 of a certain conductivity type. Substrate 12 may be a lightly-doped P type (P- type) silicon substrate. It should be noted that any insulative layers are omitted in FIG. 1 in order to facilitate easy understanding; these layers will be shown in the cross-sectional views presented in FIGS. 2, 3, 4, 5, and 6.

A plurality of NAND cell units 14 are formed on substrate 12, although only one NAND cell unit is shown by reference numeral "14*i*" (the suffix "i" may be a selected integer, and may be dropped) in FIG. 1 only for the purpose of simplification of illustration. Each of these NAND cell units has substantially the same configuration: the following explanation with respect to NAND cell 14*i* illustrated will also applied to the remaining NAND cells in EEPROM 10.

As shown in FIG. 1, NAND cell unit 14*i* has an array of a preselected number of data storage transistors M that are connected in series with one another. Each NAND cell unit also has two selection transistors Qs1 and Qs2, which are provided at the both ends of the series array of data storage transistors M, which will be called "memory cell transistor," or "cell transistor." In this embodiment, eight cell transistors M1, M2, ..., M8 are provided in NAND cell unit 14*i*, although such number may be changed as required such as sixteen, thirty two, and or the like.

NAND cell unit 14*i* is associated with a corresponding bit line BLi that is a conductive layer 16 made of aluminum, for example. First selection transistor Qs1 is provided at one end of the series array of cell transistors M of NAND cell unit 14*i*. Selection transistor Qs1 is selectively rendered conductive. When selection transistor Qs1 is turned on, NAND cell unit 14*i* is connected at the drain of cell transistor M1 to the corresponding bit line BLi via the conductive selection transistor Qs1. Second selection transistor Qs2 is provided at the opposite end of the series array of cell transistors M of NAND cell unit 14*i*. Selection transistor Qs1 is also selectively rendered conductive. When selection transistor Qs2 is turned on, NAND cell unit 14*i* is then connected at the source of cell transistor M8 to a common source region of EEPROM 10.

Memory cell transistors M1 to M8 in NAND cell unit 14*i* are metal oxide semiconductor field effect transistors (MOSFETs) each having a floating gate layer 18-i (i=1, 2, ..., 8) and a control gate 20-i (i=1, 2, ..., 8); selection transistor Qs1 and Qs2 are switching MOSFETs each having only a control gate layer, which will be explained later in this description. Control gate layers 20 of cell transistors M serve as the "word lines" in EEPROM 10.

The structure of NAND cell unit 14*i* will be explained in more detail hereinafter with reference to FIGS. 2 through 6. In the field region of P- type silicon substrate 12 is formed an insulative layer 30 for element isolation, which is 800 nanometers thick. Element isolation layer 32 defines on substrate 12 element formation surface area, in each of which memory cells are formed. A p-type layer 32 is formed beneath element separation layer 30 as a channel stopper layer.

As shown in FIG. 2 or 3, first gate insulation thin-film layer 34 is formed in the element formation area on substrate 12. First gate insulation layer 34 has a specifically selected thickness to enable tunneling current to flow therethrough. First polycrystalline silicon layer, which serves as the floating gate layer 18-i (i=1, 2, ..., 8, in this embodiment) for carrier storage of every NAND cell transistor Mi, is formed insulatively above gate insulation film layer 34 in each of NAND cell transistor area. As shown in FIG. 2, floating gate layer 18 is formed by patterning so that its both ends extend to be terminated in element isolation layers 30 located at the opposite sides of NAND cell unit area on substrate 12, respectively.

Second polycrystalline silicon layer, which serves as control gate layer 20 is formed above first polycrystalline silicon layer, e.g., floating gate layer 18, in each NAND cell transistor area. Control gate layer 20-i is insulated by second gate insulation layer 39, which is sandwiched between layers 18 and 20. Control gates 20-1, 20-2, ..., 20-8 may be used as the "word lines" for memory cell transistors M1, M2, ..., M8 in NAND cell unit 14.

Each control gate layer 20-i is covered with insulative layer 36 as clearly shown in FIG. 2, 3 or 4. This layer 36 may be formed by CVD process, and is therefore called as the "CVD insulation layer." A conductive layer 16 serving as the bit line BLi is formed on CVD insulation layer 36 to have a linear plan shape as shown in FIG. 1. Bit line layer 16 may be made of aluminum. Bit lines BL are parallel with each other at a predetermined interval along the extending direction of word lines, e.g., control gate layers 20 of cell transistors M in NAND cell units 14.

Two selection transistors Qs1 and Qs2 are provided at both ends of the series-circuit of NAND cell transistors M1 to M8. First selection transistor Qs1 is connected between first cell transistor M1 of NAND cell unit 14i and bit line BLi associated with this NAND cell unit 14i, as shown in FIG. 1. Second selection transistor Qs2 is connected between the eighth cell transistor M8 of NAND cell unit 14i and substrate 12 having a substrate voltage Vss, which may be referred to as the "source voltage," or "common source voltage"; it may be set to ground voltage potential in some cases.

As clearly shown in FIG. 5, each of first and second selection transistors Qs1 and Qs2 has a gate electrode that is formed of a double-layered polycrystalline silicon layers. The double-layered gate electrode of selection transistor Qs1 is connected with selection gate control line SG1, while that of second selection transistor Qs2 is connected with selection gate control line SG2, as known in FIG. 1.

More specifically, selection transistor Qs1 has a first polycrystalline silicon layer 40 and a second polycrystalline silicon layer 42 which is insulatively disposed above layer 40. First polycrystalline silicon layer 40 is formed by patterning from the same layer prepared to form floating gate layers 18 of NAN cell transistors M; second polycrystalline silicon layer 42 is formed by patterning from the same layer provided to form control gate layers 20 of NAND cell transistors M. The same is true for the other selection transistor Qs2: selection transistor Qs2 has a first silicon polycrystalline layer 44 and a second polycrystalline silicon layer 46 which is insulatively disposed above layer 44. Underlying polycrystalline layer 44 is formed by patterning from the same layer prepared to form floating gate layers 18, whereas second polycrystalline layer 46 is formed by patterning from the sam layer provided to form control gate layers 20 of NAND cell transistors M.

Substrate 12 has heavily-doped n type (N+ type) semiconductor layers 48, 50, 52, 54, 56, 58, 60, 62. Each of N+ layers 48, 50, 52, 54, 56, 58 is positioned in a specific substrate surface portion defined between the corresponding two adjacent gate layers 40 and 18-1, gate layers 18-i and 18-(i+1), or gate layers 18-8 and 44. These N+ type layers are formed by impurity doping after gate layers 18, 20, 40, 42, 44, and 46 are fabricated and before bit line layers 16 are formed in the manufacturing process of the EEPROM 10. The N+ type layers 48 may act as a source and drain region of a corresponding NAN cell transistor Mi. Since cell transistors M are series-connected, one of the N+ type layers 48, 50, 52, 54, 56, 58, 60 is used as the source region of a certain cell transistor Mi, while the same may be used simultaneously as the drain region of a neighboring cell transistor M(i+1). For example, N+ layer 50 is used as the source of NAND cell transistor M1, and, at the same time, can function as the drain of NAND cell transistor M2 that is adjacent to cell transistor M1 as shown in FIG. 5. It should be noted that N+ layer 62 is larger in size than the remaining ones since it is also used as a contact portion with bit line 16, wherein a contact hole 64 is formed in CVD insulation layer 36 so as to allow bit line 16 to be in contact with N+layer 62, which acts as the drain of first selection transistor Qs1.

First selection transistor Qs1 is rendered conductive to thereby allow the NAND cell unit 14i to be connected to the corresponding bit line BLI associated therewith. More specifically, when selection transistor Qs1 is turned on, the drain of NAND cell transistor M1 is electrically connected with the corresponding bit line BLi. On the other hand, when second selection transistor Qs2 is rendered conductive, the NAND cell unit 14i is connected to the common source voltage at the source of the eighth cell transistor M8 in NAND cell unit 14i.

Very importantly, double-layered gate structure of first selection transistor Qs1, e.g., layers 40 and 42 are in direct contact with each other at a plurality of contact portions, only one of which is visible in FIGS. 1 or 6 as designated by reference numeral "70." Conductive layer, say the third polycrystalline silicon layer, each of which is formed by patterning process to have a plan shape shown in FIG. 1 may be used as the contact layers for connecting together gate layers 40 and 42. These layers 70 may be provided at a predetermined interval along the direction parallel with word lines WL. The interval of contact layers 70 may be set to a distance between a couple of selected NAND cell units, for example, NAND cell units 14i and 14(i+8), or 14(i+16), although it should not be necessarily a fixed distance value. In this case, the lower gate layer 40 is continuously formed, while the upper gate layer 42 is divided into a plurality of layer portions, every two adjacent ones of which are conducted together by contact layer 70 and are simultaneously connected with the lower gate layer 40. The similar contact structure may also be utilized for the double-layered gate electrode of the other selection transistor Qs2, consisting of gate layers 44 and 46.

In addition to the aforementioned NAND cell structure, another conductive, linear-shaped layer 72 is specifically provided in an element isolation area defined between ever two neighboring bit lines BLi and BL(i+1), which is not visible in FIG. 1. The additional layer 72 is formed on CVD insulation layer 36 so that it runs in parallel with bit lines BL. Layer 72 may be an aluminum layer. Layer 72 may be formed between every two neighboring bit lines BLi and BL(i+1).

As shown in FIG. 6, layer 72 is connected to P-substrate 12 in such a manner that it is connected via contact hole 74 formed in CVD insulation layer 36 with P+ type diffusion layer 76, which is formed in p type layer 78 that is formed in substrate 12 as what is called the "channel stopper" layer. Channel stopper layer 78 is formed beneath elements separation layer 30 in substrate 12 so as to extend in parallel with bit lines BL. Layer 72 is connected with P- type substrate 12 by P+ type layer 76 so that the contact resistance between layer 72 and substrate 12 can be minimized. With such an arrangement, conductive layer 72 is stably set to the substrate voltage Vss; in this sense, this layer will be referred to as the "substrate voltage-stabilizing electrode."

Data is written into memory cell transistors M1 to M8 in a selected NAND cell unit 14i in a sequential manner, as will be described hereinafter. When EEPROM 10 is set in the data write mode, eighth cell transistor M8 in the selected NAND cell unit 14i is first subjected to the data writing; seventh cell transistor M7 is next subjected to the data writing; the remaining cell transistors M6, . . . , M3, M2, and M1 are then subjected to the data writing sequentially in this order. Summarizing such "sequential data write" feature, when a NAND cell unit 14i is designated as the selected NAND cell unit, then the memory cell transistors M included therein are sequentially subjected to data write operations in a specific order that the last cell transistor M8, which is positioned most far from the first selection transistor Qs1 for connecting this NAND cell unit 14i to the corresponding bit line BLi, is first selected, the neighboring cell transistors M7, . . . , M3, M2 are sequentially selected, and the first cell transistor M1, which is positioned in adjacent to the first selection transistor Qs1, is selected lastly.

In accordance with the above "sequential data write" mode, in order to write data into memory cell transistor M1 first, a high-level voltage of 20 volts, for example, is applied to word line WL8 connected to the control gate of the selected NAND cell transistor M8, while a low-level voltage such as 0 volts is applied to a bit line BLi that is associated with the selected NAND cell unit 14i. At this time, word lines WL1 to WL7 connected to control gates of the remaining NAND cell transistors M1 to M7 are being applied with an intermediate voltage having a positive value, which is lower than the high-level voltage and yet high enough to render these transistors M1 to M7 conductive. The intermediate voltage may be 10 volts. (The intermediate voltage will be applied to bit line BLi if the memory cell transistor M is not subjected to data-write operation.) Under such a condition, a data voltage appearing on bit line BLi associated with the selected NAND cell unit 14i may be transmitted to the selected transistor M8 through the remaining transistor M1 to M7, when first selection transistor QS1 is rendered conductive in response to a selection gate control signal transmitted by line SG1. Word line WL8 is then set to the substrate voltage Vss, 0 volts, for example. As a result, carriers, electrons in this case, are allowed to be injected by tunneling from drain 5 thereof into its floating gate 18-8. Storing electrons in floating gate 18-8 means that data is written in cell transistor M8. The remaining cell transistors M7, . . . , M2, M1 can be subjected to data writing operations in a similar manner as described above.

Data erase is performed by releasing electrons accumulated in floating gates of NAND cell transistors M in a "reverse-sequential" manner: NAND cell transistors M1 to M8 are sequentially subjected to data erase in the reverse order to data writing thereof. In the data erase mode, a high-level voltage such as a 20-volt voltage is applied to a bit line BLi associated with a selected NAND cell unit 14i containing a selected cell transistor M1, for example; a low-level voltage is applied to a word line WL1 that is connected to the control gate 18-1 of the selected cell transistor M1. With such voltage application, electrons stored in floating gate 18-1 are released to substrate. The second cell transistor M2 is then subjected to the data erase. In this case, the high-level voltage such as 20 volts is applied to word line WLI so that the first cell transistor M1 is rendered conductive to act as a "transmission gate" for allowing the applied high-level voltage to be transferred to the drain of the selected cell transistor M2. The cell transistors M2, M3, . . . , M8 are thus subjected to the sequential data erasing in this order.

During the aforementioned write/erase modes, substrate voltage-stabilizing electrode 72 is constantly fixed to a specific voltage having a preselected potential, which may equal to the ground potential (0 volts) or a lower potential of negative polarity value. With such voltage setting, layer 72 can be forcibly stably set to the preselected, constant voltage even if the substrate voltage Vss will be varied due to the flow of tunneling current, e.g., the transfer of electrons by tunneling between the floating gate 18 of a selected NAND cell transistor 14 and the substrate 12, since variation in substrate voltage Vss, if any, can be successfully "absorbed" principally by layer 72, and auxiliarily by channel stopper layer 78 that is connected with substrate voltage-stabilizing electrode 72. The result is that undesirable increase in substrate voltage Vss can be suppressed or eliminated, thereby to expand the operating margin of EEPROM 10, which can thus be maximized.

It should be noted that several methods may be possible for the above application of constant voltage to layer 72: on the one hand, layer 72 can be continuously applied with the constant specific voltage, substrate voltage Vss, for example, throughout the data accessing modes of EEPROM 10; on the other hand, the specific voltage Vss may be selectively applied to layer 72 at a constant interval or at changeable intervals specified during the write/erase modes.

According to the embodiment with the "substrate voltage-stabilization" feature, potential variation in substrate 12, which will become greater in highly integrated EEPROMs, can be effectively eliminated during data write and erase modes, with the result in substrate voltage Vss being stabilized to a constant voltage; the voltage breakdown phenomenon including the "surface breakdown" can be eliminated. The operating margin of EEPROMs can thus be maximized, thereby to offer an excellent data write/erase operations in high reliability.

It is also important in the above embodiment that extra layer 72 for stabilizing the substrate voltage Vss is positioned in the field area defined between two neighboring NAND cell units 14i and 14(i+1) on substrate 12, and that the contact portion 74 is specifically formed in adjacent to the contact layer 7 for connecting together the upper gate layer 42 and the lower gate layer 40 of double-layered selection gate electrode serving as selection gate control line SG1. In other words, extra layer arrangement for substrate voltage stabilization is formed in a "dead space" that is inherently of no use for any layer formation. This means that adding the "substrate voltage stabilization" electrode 72 requires principally no extra surface space of substrate 12 of limited size. Therefore, the integration density of EEPROM 10 can be prevented from being degraded with addition of substrate voltage-stabilizing layer 72.

Figure 8:
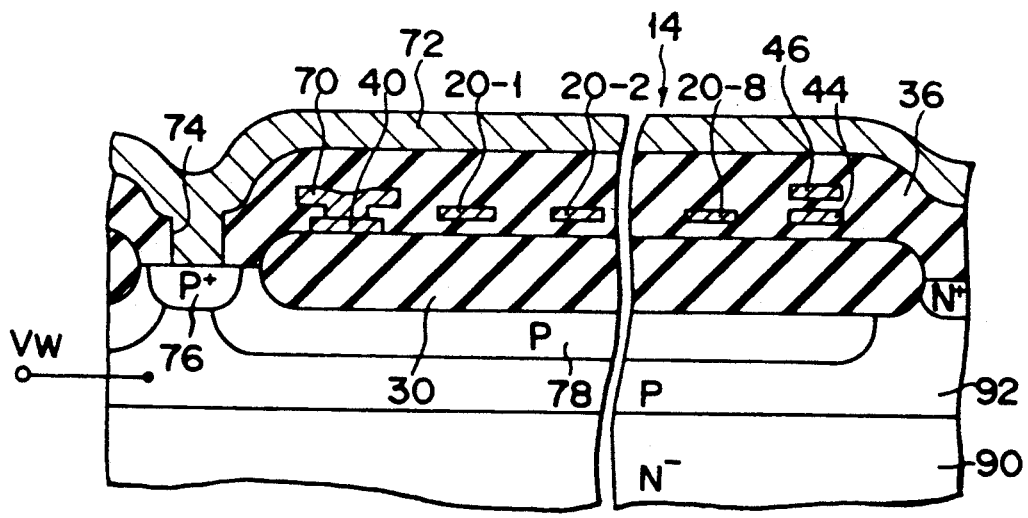
FIG. 8 is a diagram showing in a different cross-section the EEPROM shown in FIG. 7.

The above embodiment may be modified as shown in FIGS. 7 and 8, wherein N- type silicon substrate 90 is used in which p type semiconductive layer 90 is formed as what is generally called "well region." As shown in FIG. 7, NAND cell unit 14 of substantially the sam arrangement as in the prior embodiment is formed to have a series circuit of memory cell transistors M1 to M8, first selection transistor Qs1, and second selection transistor Qs2, which are formed in well region 92.

As shown in FIG. 8, substrate voltage-stabilizing layer 72 is connected via P+ layer 76 and channel stopper layer 78 to well region 92, in which tunnel current will flow due to data write or erase operation in NAND cell unit 14, and well potential Vw, where suffix "w" stands for "well," may vary. Such well potential variation or instability can be completely compensated for with making use of layer 72, since layer 72 in this case functions to stabilize the potential Vw of well region 92 by causing it to be set to a preselected voltage, which may be same as well potential Vw or a lower voltage of the negative polarity. In this embodiment, layer 72 can be called the "well-potential stabilizing electrode."

Figure 9:
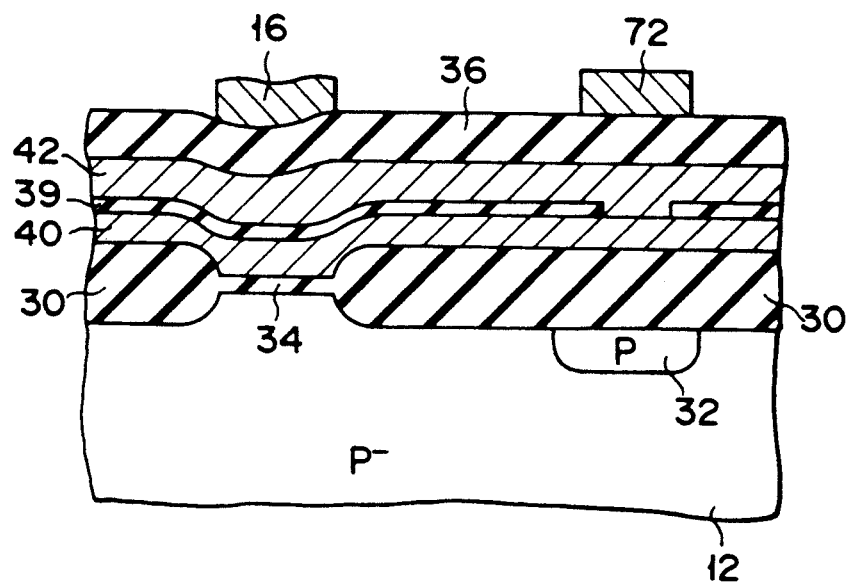
FIG. 9 is a diagram showing in a cross-section an EEPROM in accordance with still another embodiment of the present invention.

The aforementioned double-layered selection gate layer structure of selection transistor Qs1 or Qs2, or the both, may be modified as shown in FIG. 9, wherein the upper and lower polycrystalline silicon gate layers 42 and 40 are in direct contact with each other without making use of any contact layer such as contact layer 70 shown most clearly in FIG. 3. With such arrangement, the configuration of the top surface of EEPROM can be made flat so that bit line layer 16 and substrate voltage stabilizing layer 72 can be positioned at substantially the same height as shown in FIG. 9.

While the present invention has been particularly shown and described with reference to some preferred embodiments thereof, it will be understood by those skilled in the art that various changes or modifications may be made therein without departing from the spirit and scope of the invention.

For example, contact portion 64 for each bit line BLi may be positionally shifted slightly along the word lines' running direction in order to reserve an increased room for the substrate-voltage stabilizing layer 72. Obviously, the invention may be applied not only to the above presented NAND cell type EEPROMs, but also several other types of non-volatile semiconductor memory devices, such as NOR type EEPROMs, EEPROMs having FLOTOX type memory cell structure, ultraviolet erase type PROMs, and so forth.

What is claimed is:

1. A non-volatile semiconductor memory device comprising:
   a semiconductive support layer;
   parallel bit lines insulatively disposed above said support layer;
   a memory cell section containing an array of programmable memory cells associated with a certain one of said bit lines;
   potential stabilizer means for forcing said support layer to be stably held at a preselected constant voltage by applying the preselected constant voltage to said support layer in at least a selected time period while said memory cells are being subjected to at least one of a data write, read and erase operation,
   said potential stabilizer means comprising conductive wiring layer insulatively overlying said support layer and being positioned adjacent to said certain one of said bit lines, and a semiconductor region having the same conductivity type as said support layer and arranged in said support layer for connecting said conductive wiring layer to said support layer.

2. The device according to claim 1, wherein said memory cells includes a NAND cell unit having a series-connected circuit of a number of data storage transistors with control gate layers.

3. The device according to claim 1, wherein said conductive wiring layer is constantly connected to said support layer, which is set to said preselected constant voltage throughout a write period of said device.

4. The device according to claim 1, wherein said conductive wiring layer is constantly connected to said support layer, which is set to said preselected constant voltage throughout an erase period of said device.

5. The device according to claim 1, wherein said support layer comprises:
   a semiconductor substrate having a surface section in which said NAND type cell unit is formed.

6. The device according to claim 1, wherein said support layer comprises:
   a semiconductor substrate of a first type conductivity; and
   a semiconductive wall region of a second type conductivity formed in said substrate to have a surface section in which said NAND type cell unit is formed.

7. A programmable read-only memory comprising:
   a semiconductive substrate having a first surface area and a second surface area;
   parallel bit lines insulatively arranged above said substrate;
   a memory cell section arranged on said substrate and containing a NAND type cell unit associated with one of said bit lines,
   said NAND type cell unit being provided in said first surface area and having a series-connected circuit of a number of data storage transistors with control gate layers and a switching transistor;
   a conductive layer insulatively disposed above said substrate in the second surface area thereof, and positioned adjacent to said one of said bit lines, said conductive layer extending in parallel with said bit lines and being adapted to be coupled to a source voltage; and
   a heavily-doped semiconductor layer arranged in said substrate and having the same conductivity type as said substrate, for connecting said conductive layer to said substrate, and for suppressing said substrate from varying in potential by constantly applying the source voltage to said substrate while said memory operates in one of a write mode and an erase mode.

8. The memory according to claim 7, further comprising:
   a semiconductive layer formed in said substrate in the second surface area to have a conductivity type which is the same as that of said substrate, for serving as a channel stopper layer for said NAND type cell unit,
   said conductive layer being connected to said semiconductor layer.

9. The memory according to claim 7, wherein said conductive layer is formed between twon neighboring data transmission lines.

10. The memory according to claim 7, wherein each of said data storage transistors has a carrier storage layer insulatively provided above said substrate, and wherein said switching transistor has a selection gate and is provided between said series-circuit of data storage transistors and a corresponding data transmission line.

11. The memory according to claim 10, wherein said switching transistor has a double-layered gate electrode which has a first layer insulatively disposed above said substrate, and a second layer provided above said first layer and at least partially connected with said first layer.

12. The memory according to claim 11, further comprising:
   contact means provided at a predetermined interval along said double layered gate electrode, for electrically connecting said first layer with said second layer.

13. The memory according to claim 12, wherein said first layer and said carrier storage layer are formed in a first polycrystalline semiconductor layer insulatively disposed above said substrate.

14. The memory according to claim 13, wherein said second layer and said control gate layer are formed in a second polycrystalline layer insulatively disposed above said first polycrystalline semiconductor layer.

15. The memory according to claim 14, wherein said contact means comprises a contact layer which is formed in a third polycrystalline semiconductor layer positioned above said second polycrystalline semiconductor layer.

16. The memory according to claim 15, wherein said conductive layer at least partially overlaps with said contact layer.

17. The memory according to claim 15, wherein said conductive layer comprises a metal layer having a layer portion which is insulatively disposed above said contact layer.

18. An electrically erasable and programmable semiconductor memory device comprising:
a semiconductive support layer;
parallel bit lines insulatively overlaying said support layer;
parallel word lines insulatively crossing with said bit lines to provide cross points therebetween;
a memory cell section containing an array of memory cells arranged at those of said crossing points which are associated with a certain one of said bit lines;
switching transistor means for selectively connecting said array of memory cells to said certain one of said bit lines, said switching transistor means having double-layered conductive layers which extend in parallel with said word lines and which are electrically coupled together at a plurality of contact portions provided at a predetermined interval along said double-layered conductive layers; and
a plurality of conductive layers which extend in parallel with said bit lines and each of which overlies a corresponding one of said plurality of contact portions, said conductive layers being coupled to said support layer.

19. The device according to claim 18, further comprising:
a heavily-doped semiconductor region which has the same conductivity type as said support layer and by which a corresponding one of said conductive layers is coupled to said support layer.

20. The device according to claim 19, further comprising:
an additional semiconductor region extending linearly under said conductive layer coupled to said support layer.

21. The device according to claim 19, wherein said support layer comprises a semiconductive substrate.

22. The device according to claim 19, wherein said support layer comprises:
a semiconductive substrate; and
a semiconductive well region in said substrate, said heavily-doped semiconductor region and said additional semiconductor region being arranged in said well region.

23. The device according to claim 19, wherein said conductive layer is made from a metallic material.

24. An electrically erasable and programmable semiconductive memory device comprising:
a semiconductive support layer;
parallel bit lines insulatively overlying said support layer;
parallel word lines insulatively crossing with said bit lines to provide crossing points therebetween;
a memory cell section containing an array of memory cells arranged at those of said crossing points which are associated with a certain one of said bit lines;
switching transistor means for selectively connecting said array of memory cells to said one of said bit lines, said switching transistor means having double-layered conductive layers which extend in parallel with said word lines and which are electrically coupled together at a plurality of contact portions provided at a predetermined interval along said double-layered conductive layers; and
potential stabilizer means for stabilizing said support layer to be at a preselected constant voltage by applying the preselected constant voltage to said support layer, said potential stabilizer means comprising at least one conductive layer extending in parallel with said bit lines and overlying a corresponding one of said plurality of contact portions, said conductive layer being coupled to said support layer.

25. The device according to claim 24, wherein said potential stabilizer means comprises:
a heavily-doped semiconductor region which has the same conductivity type as said support layer and by which said conductive layer is coupled to said support layer.

26. The device according to claim 25, wherein said potential stabilizer means further comprises:
an additional semiconductor region extending linearly under said conductive layer coupled to said support layer.

27. The device according to claim 24, wherein said support layer comprises a semiconductive substrate.

28. The device according to claim 24, wherein said support lever comprises:
a semiconductive substrate; and
a semiconductive well region in said substrate, said heavily-doped semiconductor region and said additional semiconductor region being arranged in said wall region.

29. The device according to claim 24, wherein said conductive layer is made from a metallic material.

* * * * *